(12) United States Patent
Zadach et al.

(10) Patent No.: US 7,838,768 B2
(45) Date of Patent: Nov. 23, 2010

(54) ELECTRICAL DEVICE

(75) Inventors: Peter Zadach, Reutlingen (DE); Jochen Kuhn, Bad Urach (DE)

(73) Assignee: Robert Bosch GmbH, Stuttgart (DE)

( * ) Notice: Subject to any disclaimer, the term of this patent is extended or adjusted under 35 U.S.C. 154(b) by 497 days.

(21) Appl. No.: 11/791,646

(22) PCT Filed: Oct. 11, 2005

(86) PCT No.: PCT/EP2005/055161

§ 371 (c)(1),
(2), (4) Date: Apr. 3, 2008

(87) PCT Pub. No.: WO2006/056504

PCT Pub. Date: Jun. 1, 2006

(65) Prior Publication Data

US 2008/0196918 A1    Aug. 21, 2008

(30) Foreign Application Priority Data

Nov. 24, 2004  (DE) ................. 10 2004 056 662

(51) Int. Cl.
*H05K 5/06* (2006.01)

(52) U.S. Cl. ................. 174/50.5; 174/17 VA; 174/521; 174/50; 361/679.01; 181/148

(58) Field of Classification Search ............ 174/17 VA, 174/17 CT, 50, 50.5, 559, 520, 521, 53, 57, 174/58, 562, 564, 535; 361/752, 757, 796, 361/600, 679.01; 220/3.2–3.9, 4.02; 181/149, 181/155, 148, 154, 157

See application file for complete search history.

(56) References Cited

U.S. PATENT DOCUMENTS

| | | | | |
|---|---|---|---|---|
| 3,987,258 | A | | 10/1976 | Tsutsui et al. |
| 4,145,588 | A | * | 3/1979 | Orcutt ....................... 200/83 P |
| 5,434,748 | A | * | 7/1995 | Fukui et al. ................. 174/559 |
| 5,497,290 | A | | 3/1996 | Fukui et al. |
| 6,297,448 | B1 | * | 10/2001 | Hara ............................ 174/559 |
| 6,816,381 | B2 | * | 11/2004 | Takeuchi ..................... 174/50 |

FOREIGN PATENT DOCUMENTS

| | | |
|---|---|---|
| DE | 17 90 076 | 6/1959 |
| DE | 38 17 227 | 11/1989 |
| DE | 9115939 | 3/1992 |
| DE | 4447513 | 2/1996 |
| EP | 0 377 067 | 7/1990 |
| EP | 0 961 534 | 12/1999 |
| EP | 1 022 507 | 7/2000 |
| FR | 1 335 095 | 8/1963 |
| FR | 2 854 023 | 10/2004 |
| JP | 56152057 | 11/1981 |
| JP | 61142796 | 6/1986 |
| JP | 6270669 | 9/1994 |

* cited by examiner

*Primary Examiner*—Angel R Estrada
(74) *Attorney, Agent, or Firm*—Kenyon & Kenyon LLP

(57) ABSTRACT

An electrical device having a housing and moisture-sensitive electrical structural units situated in the housing, having a pressure compensation element situated in a housing part, which avoids, preferably prevents, the ingress of moisture, the pressure compensation element including a diaphragm which is permeable to gas, having an impact protection element situated in front of the diaphragm, which at least avoids spraying a liquid directly onto the diaphragm, wherein the impact protection element is in one piece part of the housing part.

14 Claims, 2 Drawing Sheets

ELECTRICAL DEVICE

FIELD OF THE INVENTION

The present invention relates to an electrical device having a pressure compensation element.

BACKGROUND INFORMATION

An electrical device having a pressure compensation element is described in German Patent Application No. DE 38 17 227, in which the pressure compensation element is inserted into an opening in a housing. A disadvantage of this design is that on the one hand the pressure compensation element is composed of numerous individual parts, and on the other hand an additional joining process is necessary for fastening the pressure compensation element in the housing.

SUMMARY OF THE INVENTION

The electrical device according to the present invention has the advantage that the design of the impact protection element as a part connected in one piece to the housing part results overall in an electrical device having a pressure compensation element which on the one hand is very effective and on the other hand is very easy to manufacture.

According to a further embodiment of the present invention, the impact protection element is situated in a recess and extends or rises above a base of the recess. As a result of these measures it is very difficult for the liquid impinging on the electrical device, for example during high-pressure cleaning using a compact high-speed liquid jet, to, on the one hand, deflect this liquid jet onto the impact protection element, and on the other hand, to exert high pressure on the surfaces at that location. These measures on the one hand avoid liquid even reaching the region of the pressure compensation element, and on the other hand avoid liquid striking the surfaces at a high momentum. As a result of these measures, very little liquid reaches a diaphragm at all. If the impact protection element is fastened to the base of the above-mentioned recess via individual supports, it is possible to provide openings which enable air exchange with the interior of the housing for the electrical device. When the outer sides of the supports form an enveloping surface in the shape of a truncated cone, this results, on the one hand, in the above-mentioned surface which is hardly exposable to a direct liquid jet, and on the other hand this design allows this contour of the pressure compensation element to be easily demolded from an injection mold. This injection mold is necessary for manufacturing the housing part having the contour of the pressure compensation element.

As the result of providing openings between the supports which are oriented essentially perpendicular to the outwardly facing surface of the impact protection element, the openings are hardly impacted directly by the above-mentioned liquid jet, so that there is little or no impingement by the liquid jet on the diaphragm located therebeneath. This allows the diaphragm to reliably remain fixed in place; i.e., the diaphragm is not detachable under liquid pressure. If the preferably circular diaphragm is fastened to a back side of the base facing the interior of the housing, preferably by use of an integral jointing process, on the one hand the diaphragm is particularly well protected from the outside and on the other hand a particularly large annular surface on the back side of the base is obtained which is used to fasten the diaphragm. Thus, the diaphragm surface is also independent of the surface area of the openings between the surroundings of the electrical device and the diaphragm.

When an annular ridge extends between the base and the impact protection element, this allows further deflection of a surge of water which could possibly penetrate this region, i.e., into the recess, thereby further reducing the kinetic energy of the water. The pressure on the diaphragm is thus further reduced. The reliability and durability of the diaphragm or the diaphragm fastening is increased.

A further possibility for improving the fastening of the diaphragm is to provide on the back side of the impact protection element a pin which extends from the base into the housing interior. The pin preferably ends in the plane of the above-mentioned annular surface to which the diaphragm is fastened, so that the diaphragm may be additionally fastened, without tension, on a cylindrical end face of the pin.

According to a further embodiment of the present invention, the recess in which the impact protection element is situated is formed by a truncated cone-shaped ring. This allows the housing part manufactured by the injection molding process, for example, to be easily demolded from both sides of the housing part.

Furthermore, the truncated cone-shaped ring projects beyond an outer surface of the housing part. This results in a type of annular wall which at least partially ensures that a liquid flowing along the surface of the housing part does not flow into the recess.

In addition, the truncated cone-shaped ring projecting beyond the surface of the housing part extends beyond an essentially funnel-shaped outer surface of the housing part. When, for example, a specified cuboidal dimension is not to be exceeded for the control unit or electrical device, this still allows the surface to be formed by this ring, which then projects far enough so that ultimately the ring at best is in flush abutment with the housing surface—which usually forms a surface—adjoining the funnel-shaped surface.

The pressure compensation element is composed of two parts, namely a housing shell bearing the impact protection element and the diaphragm itself. These requirements ultimately result in a particularly easily manufactured and assembled, and therefore economical, housing part together with a pressure compensation element or a corresponding electrical device.

The geometry of the housing part which avoid a penetration of liquid may be produced from two molding tools. This results in an overall reduction of the tool costs and therefore the manufacturing costs.

In addition, the liquid-repellent geometry or contour may be produced without so-called cross slides in the injection mold.

DETAILED DESCRIPTION

Figure 1:
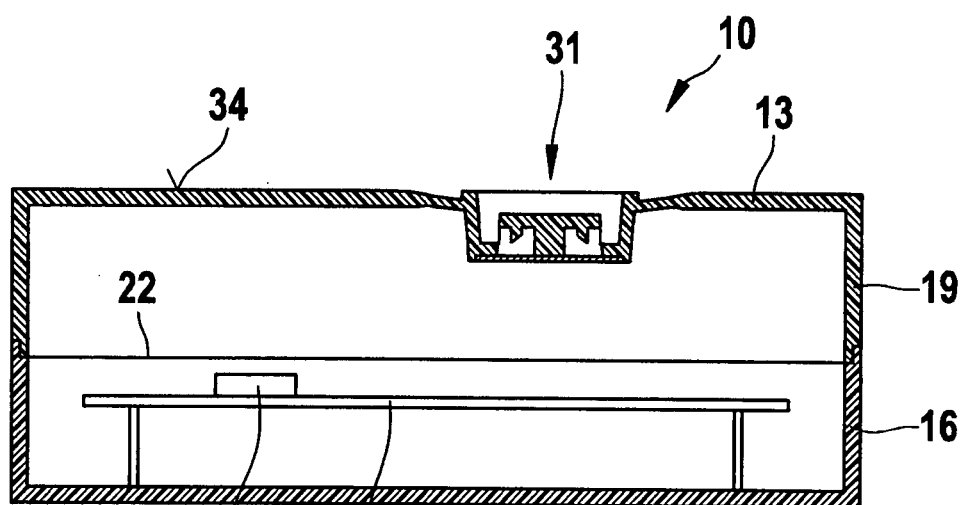
FIG. 1 shows a schematic cross-sectional illustration of an electrical device together with a pressure compensation element.

FIG. 1 shows a cross section of an electrical device 10. Electrical device 10 has a housing 13 composed of a lower housing part 16 and an upper housing part 19. Both housing parts 16 and 19 together form housing 13 having joint 22. In housing 13 itself a printed circuit board 25 is provided, to which the moisture-sensitive electrical modules, for example electrical module 28, are fastened. Upper housing part 19 has a pressure compensation element 31 which allows gas exchange through a surface 34 of housing part 19. This gas exchange is necessary so that housing 13 is not exposed to excessive mechanical stresses at various external temperatures. The aim is to avoid leaks from occurring in the housing or that external or internal air pressure even destroys the housing.

Figure 2:
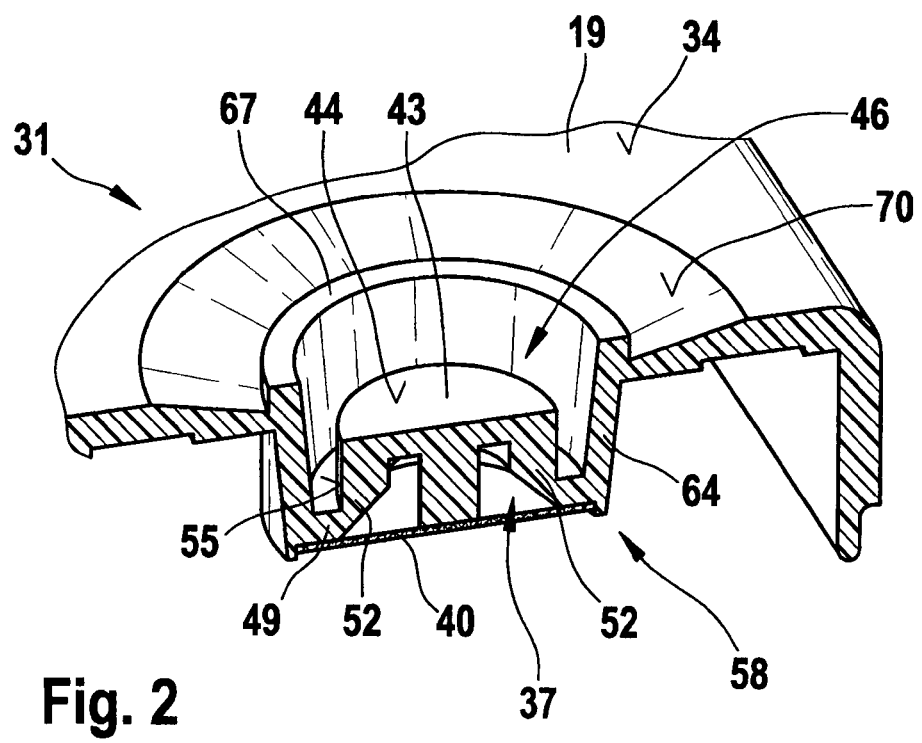
FIG. 2 shows a cross section of the pressure compensation element and the housing part for the electrical device from FIG. 1.

FIG. 2 shows a three-dimensional view of a section of pressure compensation element 31 mentioned above. In this case the line of vision is directed on outer surface 34 of housing 13. On its upper surface 34 housing part 19 has pressure compensation element 31. This pressure compensation element is composed of at least one opening 37 and a diaphragm 40 situated downstream from opening 37 in the direction facing the housing interior. An impact protection element 43 is provided so that a liquid jet which externally strikes housing part 19 cannot directly apply pressure on diaphragm 40 via opening or openings 37. In the example according to FIG. 2, this impact protection element 43 has a surface 44 which has essentially the same orientation as surface 34 of housing part 19. Impact protection element 43 is designed as one piece with housing part 19, and is therefore a part of housing part 19.

The outwardly facing surface of impact protection element 43 terminates considerably below surface 34 of housing part 19.

An electrical device 10 is thus provided having a housing 13, moisture-sensitive electrical modules 28 being situated in housing 13, and a pressure compensation element 31 being provided in a housing part 13 which avoids or prevents penetration of moisture. Pressure compensation element 31 has a diaphragm 40 which is permeable to gas, and has an impact protection element 43 situated in front of diaphragm 40 which at least prevents liquid from splattering directly on diaphragm 40. Impact protection element 43 is designed as one piece with housing part 13.

Impact protection element 43 is designed so that it may be impinged on relatively little by a direct liquid jet, for which reason impact protection element 43 is situated in a recess 46. This recess 46 has a base 49, and impact protection element 43 rises or extends above the level of the base in the manner of a pedestal. Impact protection element 43, which as such is an approximately circular plate having surface 44, is thus fastened in one piece to base 49 via individual supports 52. The outer sides of supports 52 form a prismatic enveloping surface 55 which, as illustrated in FIG. 2, preferably has the exterior shape of a perforated truncated cone due to opening or openings 37. Ideally this enveloping surface 55 would have a cylindrical design, but in practice this has not proven to be satisfactory because of process engineering constraints (demolding).

Recess 46 facilitates the runoff of liquid and contaminants on surface 44 of impact protection element 43, which is oriented transversely or in the direction of gravity.

Furthermore, openings 37 are provided between supports 52. Because of the orientation of the above-mentioned enveloping surface 55, these openings 37 are oriented essentially perpendicular to the outwardly facing surface 44 of impact protection element 43. In this regard also see FIG. 3, in which openings 37 are more easily identifiable.

Each individual opening 37 preferably has a compact surface area of approximately 4 mm$^2$ or greater, but at least 3 mm$^2$. A "compact" surface area means that the length of the circumferential border of an individual opening 37 is as short as possible; i.e., opening 37 has a round or rectangular, ideally square, area, for example. Oppositely situated border edges of opening 37 should be at least 2 mm apart.

An annular ridge 58, which is also adjoined by an annular surface 61 (see FIG. 3), extends on the back side of base 49 into the interior of housing 13. As shown in FIG. 2 but also identifiable in FIG. 3, this annular ridge 58 forms a boundary inside which diaphragm 40, which in the exemplary embodiment is circular, is or becomes fastened to annular ridge 61.

Figure 3:
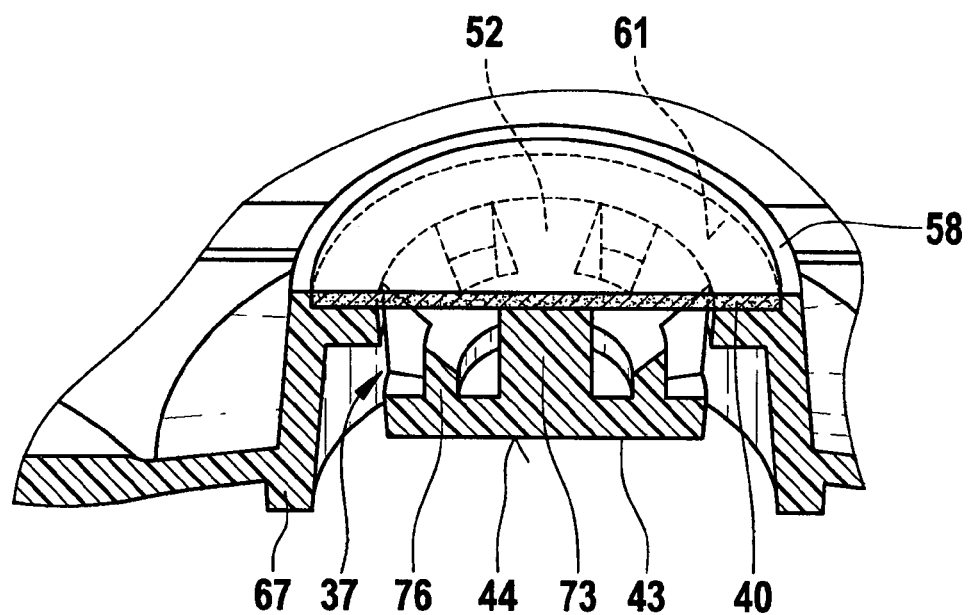
FIG. 3 shows a cutaway three-dimensional illustration of the pressure compensation element from FIG. 2 in a view from the underside.

Whereas supports 52 mentioned above extend radially inward from base 49 and to the outside, a truncated cone-shaped ring 64 extends radially outward from the edge of base 49. Here as well a cylindrical ring would be ideal, but in this case the same constraints previously mentioned for enveloping surface 55 apply. Truncated cone-shaped ring 64 begins at base 49 and extends in the direction of surface 34 of housing part 19. This truncated cone-shaped ring 64 forms pot-shaped recess 46. At this location truncated cone-shaped ring 64 projects beyond outer surface 34 of housing part 19 and terminates in an annular wall 67 which forms a collar-like protective element or wall and thus partially prevents the penetration of liquid into recess 46. In the exemplary embodiment, this annular wall 67 ends in a funnel-shaped surface 70 which is lowered with respect to further surface 34, so that annular wall 67 does not project beyond, for example, a cuboidal surface of housing 13. However, annular wall 67 can still extend beyond surface 34 without exceeding the cuboidal boundary. FIG. 3 shows the manner in which diaphragm 40 rests on annular surface 61. This back side of base 49 facing the interior of housing 13 bears the preferably circular diaphragm 40, which likewise is preferably fastened at that location via an integral jointing process. Examples of integral jointing processes used here include a welding process (ultrasonic welding) or a gluing process.

To better support diaphragm 40, the diaphragm may be additionally supported by a pin 73. This pin 73 extends on the back side of base 49 toward the interior of the housing and ends at the level of annular surface 61. In this case, diaphragm 40 may likewise be fastened or fixed using an integral jointing process.

As clearly shown in FIG. 3, an annular ridge 76 extends between base 49 and impact protection element 43. This annular ridge 76 acts as part of a labyrinth for a water jet which surges into recess 46 from below, as shown in FIG. 3, thereby reducing the kinetic energy of the water jet. Annular ridge 76 thus acts as a type of barrier and prevents excessive wetting of diaphragm 40. In addition, diaphragm 40 is preferably made of polytetrafluoroethylene (PTFE) film.

Annular ridge 76 at least partially prevents water or liquid rebounding from the wall of recess 46 from directly striking diaphragm 40.

It is easily seen that pressure compensation element 31 is composed of two parts, namely a housing part 19 which supports impact protection element 43 and diaphragm 40. A liquid-repellent geometry (recess 46, base truncated cone-shaped ring 64, base 49, supports 52, opening 37, impact protection element 43; also optionally pin 73, annular ridge 76, annular ridge 58, annular wall 67, funnel-shaped surface 70) may be produced from two molds (also see FIG. 4). In the region of pressure compensation element 31 the molds constitute an upper molding part 79 and a lower molding part 82, which may be supplemented by the fact that the liquid-repellent geometry may be represented without cross slides. Openings 37 are situated in a dividing surface 85 formed by the two molds.

Figure 4:
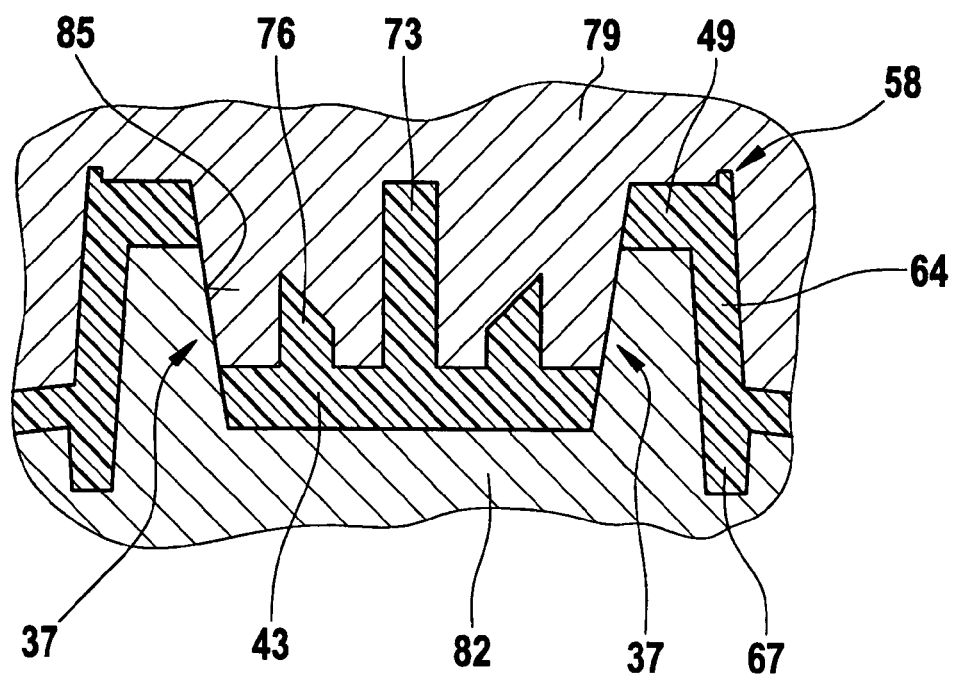
FIG. 4 shows a cross section of two parts of an injection mold which with regard to the contour of the pressure compensation element is free of cross slides, having a liquid-repellent geometry or contour of the pressure compensation element incorporated therein.

In addition, the liquid-repellent geometry (see above) may be produced without cross slides in the injection mold (see FIG. 4).

If, for example, a liquid jet directly strikes recess 46, a portion of the liquid jet is diverted by impact protection element 43. Part of the liquid which flows down to base 49 is compressed into opening 37, but at that location it is at least slightly decelerated by an annular ridge 76 which may be present. This labyrinth-like design of the flow path down to diaphragm 40 results in an increase in the flow resistance from surface 34 to diaphragm 40. This necessarily causes the quantity of liquid ultimately reaching diaphragm 40 to be smaller than it would otherwise be.

Pressure compensation element 31 functions as follows: When a liquid jet obliquely strikes housing part 19, a portion of this jet is diverted by annular wall 67 which may be present, and does not travel even as far as recess 46. As a result of the oblique impact by the liquid jet which occurs anyway, the liquid jet is practically prevented from directly striking openings 37, since impact protection element 43 is located too far below surface 34. The oblique liquid jet is diverted and decelerated at the surface of truncated cone-shaped ring 64 facing impact protection element 43. Further deceleration is then achieved as a result of the deflection into openings 37. The portion of the jet which enters is then decelerated once again at this location by annular ridge 76 which may be present. Here as well, therefore, there is very little impingement by the liquid on gas-permeable diaphragm 40.

What is claimed is:

1. An electrical device comprising:
   a housing having at least one housing part;
   moisture-sensitive electric structural units situated in the housing;
   a pressure compensation element situated in the housing part, which avoids an ingress of moisture, the pressure compensation element having a diaphragm which is permeable to gas; and
   an impact protection element situated in front of the diaphragm, which at least avoids spraying a liquid directly onto the diaphragm, the impact protection element being in one piece part of the housing part;
   wherein the impact protection element is situated in a recess and extends or rises above a base of the recess.

2. The electrical device according to claim 1, wherein the ingress of moisture is prevented.

3. The electrical device according to claim 1, wherein the impact protection element is fastened to the base via individual supports.

4. The electrical device according to claim 3, wherein outer sides of the supports form a prismatic enveloping surface.

5. The electrical device according to claim 1, wherein openings are situated between the supports which are oriented substantially perpendicular to an outwardly facing surface of the impact protection element.

6. The electrical device as according to claim 1, wherein the diaphragm is circular and is fastened to a back side of the base facing an interior of the housing, by use of an integral jointing method.

7. The electrical device according to claim 6, wherein an annular ridge extends between the base and the impact protection element.

8. The electrical device according to claim 6, further comprising, on the back side of the base, a pin extending into the housing interior, and wherein the diaphragm which extends over the pin is fastened to the pin in an integral manner.

9. The electrical device according to claim 1, wherein the recess is formed by a truncated cone-shaped ring.

10. The electrical device according to claim 9, wherein the truncated cone-shaped ring projects beyond an outer surface of the housing part.

11. The electrical device according to claim 10, wherein a surface of the housing part is funnel-shaped at a location.

12. The electrical device according to claim 1, wherein the pressure compensation element is composed of two parts, the housing part bearing the impact protection element and the diaphragm.

13. The electrical device according to claim 1, wherein a liquid-repellent geometry is produced from two molding tools.

14. The electrical device according to claim 1, wherein a liquid-repellent geometry is produced without cross slides.

* * * * *